United States Patent
Hsieh et al.

(10) Patent No.: US 9,153,640 B2
(45) Date of Patent: Oct. 6, 2015

(54) PROCESS FOR FORMING A CAPACITOR STRUCTURE WITH RUTILE TITANIUM OXIDE DIELECTRIC FILM

(71) Applicant: NANYA TECHNOLOGY CORP., Tao-Yuan Hsien (TW)

(72) Inventors: Chun-I Hsieh, Taoyuan County (TW); Daniel Damjanovic, Perrysburg, OH (US)

(73) Assignee: NANYA TECHNOLOGY CORP., Gueishan Dist., Taoyuan (TW)

( * ) Notice: Subject to any disclaimer, the term of this patent is extended or adjusted under 35 U.S.C. 154(b) by 0 days.

(21) Appl. No.: 14/320,633

(22) Filed: Jun. 30, 2014

(65) Prior Publication Data
US 2014/0315368 A1 Oct. 23, 2014

Related U.S. Application Data

(63) Continuation of application No. 13/732,442, filed on Jan. 2, 2013, now abandoned.

(51) Int. Cl.
*H01L 21/20* (2006.01)
*H01L 49/02* (2006.01)
*H01G 4/10* (2006.01)
*H01L 21/02* (2006.01)

(52) U.S. Cl.
CPC .............. *H01L 28/40* (2013.01); *H01G 4/10* (2013.01); *H01L 21/0234* (2013.01); *H01L 21/02186* (2013.01); *H01L 21/02271* (2013.01); *H01L 21/02323* (2013.01)

(58) Field of Classification Search
CPC .............. H01L 28/40; H01L 21/02186; H01L 21/0228; H01L 21/02318; H01L 21/02321; H01L 21/0234; H01G 4/10; H01G 4/12
USPC ......................................................... 438/381
See application file for complete search history.

(56) References Cited

U.S. PATENT DOCUMENTS

| 5,696,017 A | 12/1997 | Ueno |
| 7,501,320 B2 | 3/2009 | Park |
| 7,927,947 B2 | 4/2011 | Rui |
| 8,198,168 B2 | 6/2012 | Tanioku |
| 8,486,780 B2 | 7/2013 | Rui |
| 8,518,486 B2 | 8/2013 | Mirin |
| 2010/0210082 A1 * | 8/2010 | Nakamura ................. 438/253 |
| 2011/0020547 A1 | 1/2011 | Gatineau |
| 2011/0237043 A1 | 9/2011 | Kim |
| 2011/0279979 A1 * | 11/2011 | Mirin et al. ................. 361/708 |
| 2012/0322221 A1 | 12/2012 | Chen |

FOREIGN PATENT DOCUMENTS

CN 102810515 A 12/2012

* cited by examiner

*Primary Examiner* — Reema Patel
*Assistant Examiner* — Syed Gheyas
(74) *Attorney, Agent, or Firm* — Winston Hsu; Scott Margo

(57) ABSTRACT

A process of forming a capacitor structure includes providing a substrate. Next, a first electrode is deposited onto the substrate. Later, a water-based ALD process is performed to deposit a transitional amorphous $TiO_2$ layer on the first electrode. Subsequently, the transitional amorphous $TiO_2$ layer is treated by oxygen plasma to transform the entire transitional amorphous TiO2 layer into a rutile $TiO_2$ layer. Finally, a second electrode is deposited on the rutile $TiO_2$ layer.

10 Claims, 3 Drawing Sheets

US 9,153,640 B2

PROCESS FOR FORMING A CAPACITOR STRUCTURE WITH RUTILE TITANIUM OXIDE DIELECTRIC FILM

CROSS REFERENCE TO RELATED APPLICATIONS

This patent application is a continuation application of and claims priority to U.S. patent application Ser. No. 13/732,442, filed on Jan. 2, 2013, and entitled "SEMICONDUCTOR DEVICE WITH RUTILE TITANIUM OXIDE DIELECTRIC FILM" the entire contents of which are incorporated herein by reference.

BACKGROUND OF THE INVENTION

1. Field of the Invention

The present invention relates to semiconductor devices and more particularly, to an improved high-k dielectric layer, a capacitor structure using the same, and an exemplary fabrication method thereof.

2. Description of the Prior Art

As known in the art, downscaling of the metal-insulator-metal capacitor for dynamic random access memory (DRAM) devices has required the introduction of high permittivity dielectrics, for example, titanium oxide ($TiO_2$). It is well known that titanium oxide has multiple phases which have different dielectric constants. Two known phases of titanium oxide are anatase and rutile. It is often desirable to increase rutile $TiO_2$ in the capacitor dielectric film because it has a much higher dielectric constant (k>90) than anatase $TiO_2$.

Typically, $TiO_2$ dielectric layer is deposited by using an atomic layer deposition (ALD) method. However, $TiO_2$ is inherently formed in the anatase phase during the ALD process. To form a $TiO_2$ dielectric layer with the rutile phase and low leakage as well, methods such as impurity doping, post annealing (600° C. or higher) and/or ozone-based ALD in combination with template layers are employed. However, the impurity doping method has problems such as high cost, low throughput and is hard to control its distribution. The drawback of the post annealing method is the additional thermal budget and mechanical stress, which may seriously degrade the MOS devices. The problems of the ozone-based ALD/template layer method include low deposition rate (~0.4 Å per ALD cycle) and the risk of etching or oxidizing the underlying layer.

Water-based ALD method, which uses water vapor as oxidant in the ALD cycles, is also employed to deposit the $TiO_2$ dielectric layer. The water-based ALD method has a much higher deposition rate than the ozone-based ALD method, meaning higher throughput. However, $TiO_2$ deposited using the water-based ALD method is inherently in the anatase phase. To form rutile $TiO_2$ in the water-based ALD process, a 10 nm thick $TiO_2$ film or a relatively higher process temperature is typically required.

There is a need in this industry to provide an improved method for depositing a high-k dielectric material such as rutile $TiO_2$ with a higher deposition/growth rate and a low leakage and without introducing the aforesaid prior art shortcomings.

SUMMARY OF THE INVENTION

According to one aspect, a process of forming a capacitor structure is provided. The process includes providing a substrate. Next, a first electrode is deposited onto the substrate. Later, a water-based ALD process is performed to deposit a transitional amorphous $TiO_2$ layer on the first electrode. Subsequently, the transitional amorphous $TiO_2$ layer is treated by oxygen plasma to transform the entire transitional amorphous $TiO_2$ layer into a rutile $TiO_2$ layer. Finally, a second electrode is deposited on the rutile $TiO_2$ layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
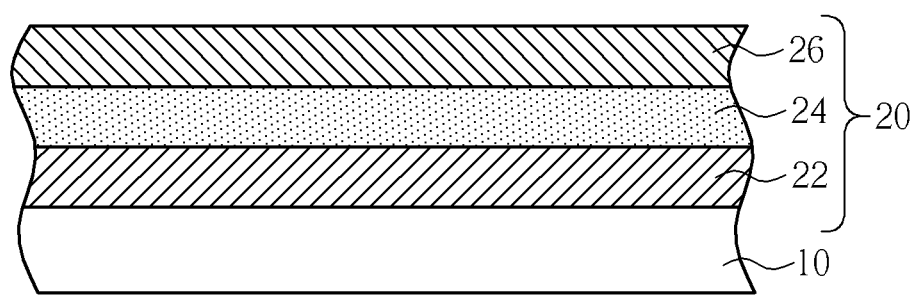
FIG. 1 is a cross-sectional diagram showing a portion of a capacitor structure according to one embodiment of this invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description, reference is made to the accompanying drawings, which form a part hereof, and in which is shown by way of illustration specific examples in which the embodiments may be practiced. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

FIG. 1 is a cross-sectional diagram showing a portion of a capacitor structure according to one embodiment of this invention. As shown in FIG. 1, the capacitor structure 20 is disposed on a substrate 10 such as a silicon-based substrate. However, it is understood that the substrate 10 may be any appropriate semiconductor substrate. The capacitor structure 20 comprises a first electrode 22, a second electrode 26 and a high-k dielectric layer 24 interposed between the first electrode 22 and the second electrode 26. According to this embodiment, the high-k dielectric layer 24 is in direct contact with the first electrode 22 and no template layer, seed layer or pre-treated layer is provided therebetween. In other embodiments, prior to the formation of the high-k dielectric layer 24, an optional dielectric layer such as $Al_2O_3$ may be deposited on the first electrode 22.

The first electrode 22 may be a noble material such as ruthenium (Ru), which has a hexagonal close-packed (HCP) crystal structure. In another embodiment, the first electrode 22 may be titanium nitride (TiN). The first electrode 22 may be deposited using any appropriate techniques such as chemical vapor deposition (CVD), ALD, physical vapor deposition (PVD), or sputtering. According to this embodiment, the high-k dielectric layer 24 that is directly deposited onto the first electrode 22 is a rutile $TiO_2$ layer. According to this embodiment, substantially, the high-k dielectric layer 24 has only one single phase: rutile. That is, the high-k dielectric layer 24 has substantially no x-ray diffraction peak associated with anatase $TiO_2$. According to this embodiment, the thickness of the high-k dielectric layer 24 is about 7 nm or thinner. According to this embodiment, no impurity such as aluminum (Al) is doped into the high-k dielectric layer 24. The second electrode 26 may be a novel metal or any suitable conductive material such as metal oxide or metal nitride. For example, the second electrode 26 may be Ru, Pt or Ir, $RuO_2$, $IrO_2$, TiN, TaN, WN or the like.

Figure 2:
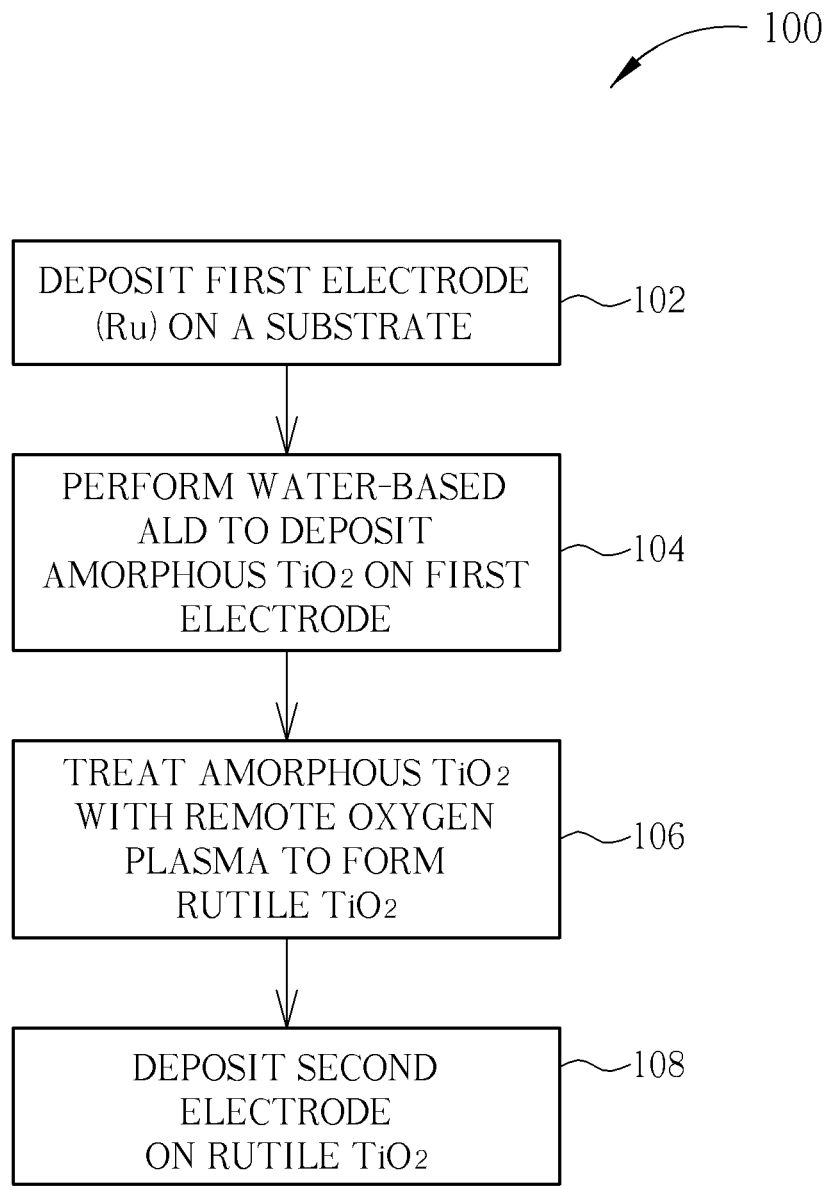
FIG. 2 is a flow chart illustrating an exemplary process of forming the capacitor structure as set forth in FIG. 1 according to this invention.

Referring now to FIG. 2 and briefly to FIG. 1, wherein FIG. 2 is a flow chart illustrating an exemplary process of forming the capacitor structure 20 as set forth in FIG. 1 according to this invention. As shown in FIG. 2, the process flow 100 includes four sequential major steps 102~108. In Step 102, the first electrode 22 such as Ru or TiN is deposited onto the substrate 10. Subsequently, in Step 104, a water-based ALD process is performed to deposit a transitional amorphous $TiO_2$ layer (not shown in FIG. 1) on the first electrode 22. According to this embodiment, the thickness of the transitional amorphous $TiO_2$ layer is about 7 nm or thinner. The aforesaid water-based ALD process may comprise a plurality of ALD cycles and each ALD cycle comprises: (1) supplying a Ti precursor into a reaction chamber (Ti pulse); (2) purging the reaction chamber with inert gas; (3) supplying water vapor into the reaction chamber (H2O pulse); and (4) purging the reaction chamber with inert gas. According to this embodiment, the process temperature may range between 150° C. and 450° C., for example, 285° C. When the Ti precursor such as $TiCl_4$ is supplied into the reaction chamber, a portion of the Ti precursor is adsorbed to an exposed surface of the substrate 10. The purge gas such as argon or nitrogen then removes the rest of the Ti precursor that is not adsorbed. The water vapor that acts as an oxidant supplied to the substrate 10 then reacts with the adsorbed Ti precursor to form a single atomic $TiO_2$ layer on the substrate 10. According to this embodiment, during the aforesaid the water-based ALD process, only the water vapor is used as an oxidant to increase the deposition or growth rate.

Subsequently, in Step 106, after the water-based ALD process, the amorphous $TiO_2$ layer is treated by oxygen plasma to thereby transform the entire amorphous $TiO_2$ layer into the rutile $TiO_2$ layer. According to this embodiment, the oxygen plasma treatment may be performed ex-situ. For example, the oxygen plasma treatment may comprise remote plasma techniques such as inductively coupled plasma (ICP) or de-coupled plasma (DCP). In a case that the oxygen plasma treatment employs ICP, a step of supplying an AC power of 500 W to 2500 W to the plasma generator may be performed. In a case that the oxygen plasma treatment employs DCP, a step of supplying an AC power of larger than 500 W to the plasma generator may be performed. The remote oxygen plasma may contain ionic oxygen and carrier gas such as argon or nitrogen. According to this embodiment, the oxygen plasma treatment increases the oxygen content in the $TiO_2$ layer. In some embodiments, the oxygen plasma treatment may be performed in-situ, for example, using plasma-enhanced ALD tools. Finally, in Step 108, the second electrode (or top electrode) is formed on the rutile $TiO_2$ layer.

It is advantageous to use the present invention because no template layer or pre-treated layer on the first electrode (bottom electrode) is required. Furthermore, impurity doping and post thermal treatment or anneal can be omitted. Since the water-based ALD process has a relatively higher deposition or growth rate, the production throughput is promoted.

Figures 3A, 3B:
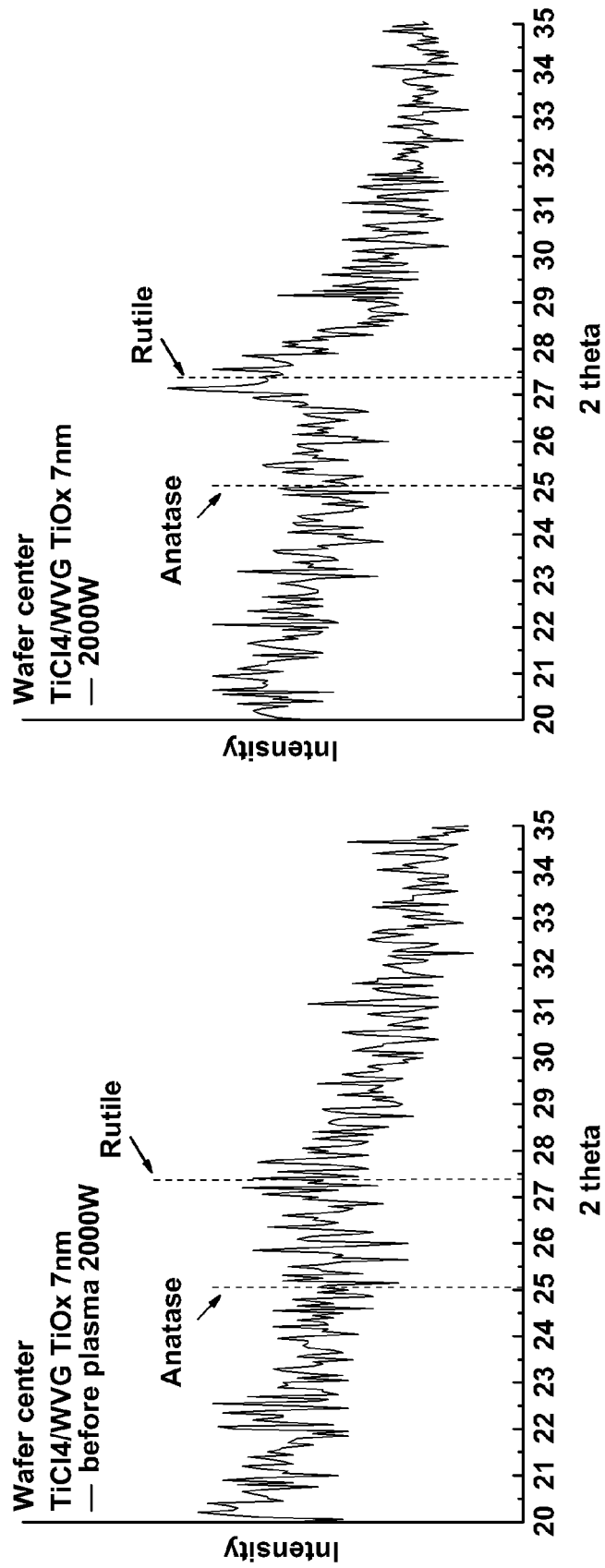
FIG. 3A and FIG. 3B show the X-ray diffraction spectrum of the water-based ALD $TiO_2$ layer.

FIG. 3A and FIG. 3B show the X-ray diffraction spectrum of the water-based ALD $TiO_2$ layer (relative intensity as a function of 2 theta) in the spectral region between 2 theta=20 and 2 theta=35. Before plasma treatment, it has been shown that the 7 nm $TiO_2$ layer is amorphous (FIG. 3A), while after the plasma treatment the 7 nm $TiO_2$ layer is completely transformed into rutile phase (FIG. 3B).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A process for forming a capacitor structure with rutile titanium oxide dielectric film, comprising:
   providing a substrate;
   depositing a first electrode onto the substrate;
   performing a water-based ALD process to deposit a transitional amorphous $TiO_2$ layer on the first electrode;
   treating the transitional amorphous $TiO_2$ layer by oxygen plasma to transform the entire transitional amorphous $TiO_2$ layer directly into a rutile $TiO_2$ layer; and
   depositing a second electrode on the rutile $TiO_2$ layer.

2. The process for forming a capacitor structure with rutile titanium oxide dielectric film according to claim 1, wherein the water-based ALD process comprises four sequential steps including:
   (1) supplying a Ti precursor into a reaction chamber;
   (2) purging the reaction chamber with inert gas;
   (3) supplying water vapor into the reaction chamber; and
   (4) purging the reaction chamber with inert gas.

3. The process for forming a capacitor structure with rutile titanium oxide dielectric film according to claim 2, wherein the water vapor acts as an oxidant and reacts with the Ti precursor to form a single atomic $TiO_2$ layer.

4. The process for forming a capacitor structure with rutile titanium oxide dielectric film according to claim 2, wherein the Ti precursor is $TiCl_4$.

5. The process for forming a capacitor structure with rutile titanium oxide dielectric film according to claim 1, wherein a temperature of the water-based ALD process is between 150° C. and 450° C.

6. The process for forming a capacitor structure with rutile titanium oxide dielectric film according to claim 1, further comprising performing the water-based ALD process plural times.

7. The process for forming a capacitor structure with rutile titanium oxide dielectric film according to claim 1, wherein the oxygen plasma is performed ex-situ.

8. The process for forming a capacitor structure according to claim 1, wherein the oxygen plasma is performed in-situ.

9. The process for forming a capacitor structure with rutile titanium oxide dielectric film according to claim 1, wherein the first electrode is in direct contact with the rutile $TiO_2$ layer.

10. The process for forming a capacitor structure with rutile titanium oxide dielectric film according to claim 1, wherein the rutile $TiO_2$ layer acts as a high-k dielectric layer.

\* \* \* \* \*